US005786953A

United States Patent [19]
Kalfs

[11] Patent Number: 5,786,953
[45] Date of Patent: Jul. 28, 1998

[54] ARRANGEMENT FOR REPRODUCING N DIGITAL SIGNALS HAVING N PHASE-LOCKED LOOPS EACH INCLUDING A PHASE SHIFTER, CONTROLLED BY AN INTEGRATING ELEMENT, ARRANGED BETWEEN A VCO OUTPUT AND A PHASE DETECTOR

[75] Inventor: Joahnnes J. W. Kalfs, Eindhoven, Netherlands

[73] Assignee: U.S. Philips Corporation, New York, N.Y.

[21] Appl. No.: 798,589

[22] Filed: Feb. 11, 1997

Related U.S. Application Data

[63] Continuation of Ser. No. 424,924, Apr. 19, 1995, abandoned.

[30] Foreign Application Priority Data

Apr. 21, 1994 [EP] European Pat. Off. ............. 94201101

[51] Int. Cl.⁶ ..................... G11B 5/09; G11B 15/12
[52] U.S. Cl. ........................... 360/51; 360/63
[58] Field of Search ..................... 360/51, 63, 26, 360/22; 331/60

[56] References Cited

U.S. PATENT DOCUMENTS

| | | | |
|---|---|---|---|
| 4,470,082 | 9/1984 | Van Pelt et al. | 360/51 |
| 5,206,769 | 4/1993 | Bailey et al. | 360/51 |
| 5,293,275 | 3/1994 | Kawasaki | 360/51 |
| 5,488,516 | 1/1996 | Kalfs | 360/51 |

*Primary Examiner*—Thang V. Tran
*Assistant Examiner*—Alan Faber
*Attorney, Agent, or Firm*—Michael E. Belk

[57] ABSTRACT

For clock extraction ($Cl_n$) from n digital signals read from each of n tracks ($T_{a.1}$ to $T_{a.n}$), there are provided n phase-locked loops (13.n). Voltage-controlled oscillator (21) is common to the n phase-locked loops. Each phase-locked loop further includes a phase-shifter unit (25.n) having an input coupled to the output of the voltage-controlled oscillator (21) and an output coupled to the second input of the phase comparator (17.n) in the loop. The phase shift in the phase-shifter unit (25.n) is controlled under the influence of a control signal which is derived by a control signal generator (26.n) and applied to a control signal input (29) of the phase-shifter unit (25.n). The control signal generator unit (26.n) is an integrating element.

7 Claims, 2 Drawing Sheets

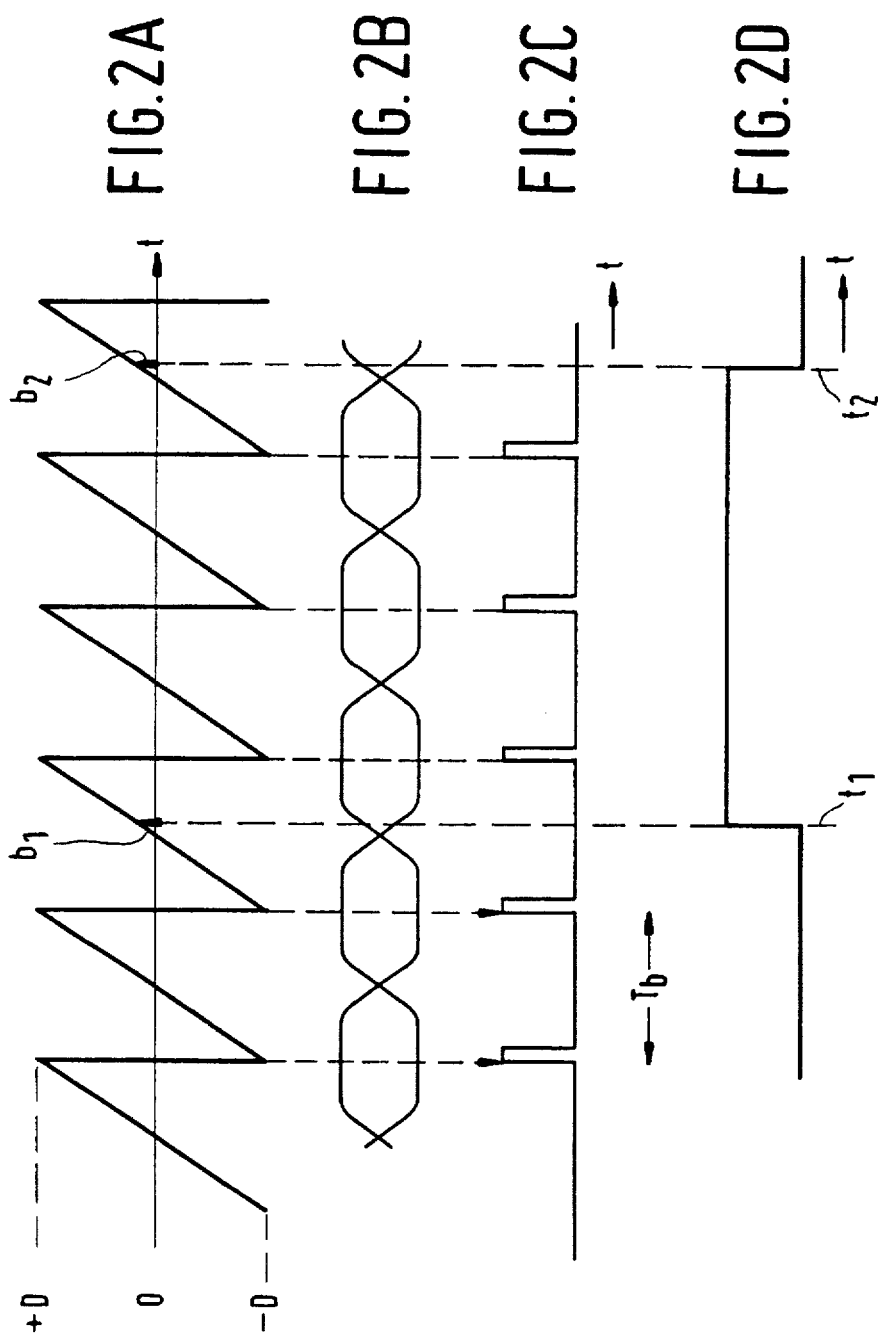

ARRANGEMENT FOR REPRODUCING N DIGITAL SIGNALS HAVING N PHASE-LOCKED LOOPS EACH INCLUDING A PHASE SHIFTER, CONTROLLED BY AN INTEGRATING ELEMENT, ARRANGED BETWEEN A VCO OUTPUT AND A PHASE DETECTOR

This is a continuation of application Ser. No. 08/424,924, filed Apr. 19, 1995, now abandoned.

BACKGROUND OF THE INVENTION

1. Field of the Invention

The invention relates to an arrangement for reproducing n digital signals from n adjacent tracks on a record carrier, n being an integer greater than 1, which arrangement comprises

- read means comprising n read heads, each having an output, for reading n information signals from the n tracks and applying said information signals to the outputs,
- n detection means having inputs coupled to the outputs of the n read heads, for deriving the n digital signals from the n information signals read from the tracks and supplying said digital signals to outputs,
- n phase-locked loops having inputs coupled to the n outputs of the read heads, each phase-locked loop comprising a phase comparator having a first input, which is coupled to the input of the phase-locked loop, a second input and an output, a voltage-controlled oscillator having an input, which is coupled to the output of the phase comparator, and an output for supplying a clock signal of a given frequency, which output is coupled to the second input of the phase comparator, the voltage-controlled oscillator being common to the n phase-locked loops, and the arrangement comprising for this purpose a signal combination unit having n inputs, each of the inputs being coupled to an output of one of the n phase comparators, and having an output coupled to the input of the voltage-controlled oscillator, and a phase-locked loop further comprising a phase-shifter unit having an input coupled to the output of the voltage-controlled oscillator, an output coupled to the second input of the phase comparator, and a control signal input, and comprising a control signal generator unit having an input coupled to the output of the phase comparator and an output coupled to the control signal input of the phase-shifter unit, and to an arrangement for deriving n clock signals from the n information signals.

2. Description of the Related Art

An arrangement of the type defined in the opening paragraph is known, for example from U.S. Pat. No. 4,470,082, document (3) in the List of Related Documents. The arrangement is also used in the form of a magnetic-tape recorder of the SDAT or the DCC type.

An arrangement of the type defined in the opening paragraph is capable of reading magnetic record carriers on which digital information has been recorded in a plurality of adjacent tracks.

The known arrangement has the drawback that it is rather susceptible to disturbances, as result of which the phase-locked loop becomes deranged.

SUMMARY OF THE INVENTION

It is an object of the invention to provide an arrangement with an improved immunity to disturbances, so that the phase-locked loop is less susceptible to become deranged.

The arrangement is characterized in that the control signal generator unit is an integrating element.

The invention is based on the recognition of the following fact, that disturbances in one of the channels may lead to the phase-shifter unit being deranged. By averaging the output signal of the phase comparator in an integrating element and deriving therefrom the control signal for the phase-shifter unit, it is possible to obtain a control system which is less susceptible to these disturbances.

Preferably, the integrating element has a time constant which is comparatively large relative to the bit period in the digital signal. Thus, it is achieved that the output signal of the phase comparator is averaged over a sufficiently long time.

It is to be noted that the previously filed U.S. patent application Ser. No. 08/184,624, document (1) in the list of documents at the end of the present Application, and European Patent Application 93.201.327, corresponding to U.S. patent application Ser. No. 08/214,913, now U.S. Pat. No. 08/214,913, now U.S. Pat. No. 5,488,516; document (2) in the list, also describe arrangements for deriving a clock signal from signals read from n tracks. However, there is no mention of a voltage-controlled oscillator common to all the phase-locked loops.

BRIEF DESCRIPTION OF THE DRAWINGS

An exemplary embodiment of the invention will be described in more detail hereinafter with reference to the drawings, in which:

FIGS. 2a, 2b, 2c and 2d show some signal waveforms appearing in the exemplary embodiment shown in FIG. 1.

FIG. 1 shows an arrangement intended for reading a digital signal from n tracks $T_{a,1}$ to $T_{a,n}$ recorded adjacent to one another and in the longitudinal direction of a magnetic record carrier 20 in the form of a tape. Only one half of the record carrier is shown. The arrangement has read means comprising n read heads 14.1 to 14.n, which reproduce n analog signals from the n tracks. The n analog signals are applied to an n-channel sampler 11. Under the influence of a clock signal having a clock frequency $f_b$, which is applied to the sampler 11 by a fixed oscillator 12, the analog signals are sampled and converted into n binary digital signals ch 1 to ch n, respectively. The frequency $f_b$ is at least one order of magnitude higher than the clock frequencies $cl_i$ referred to hereinafter.

Figure 1:
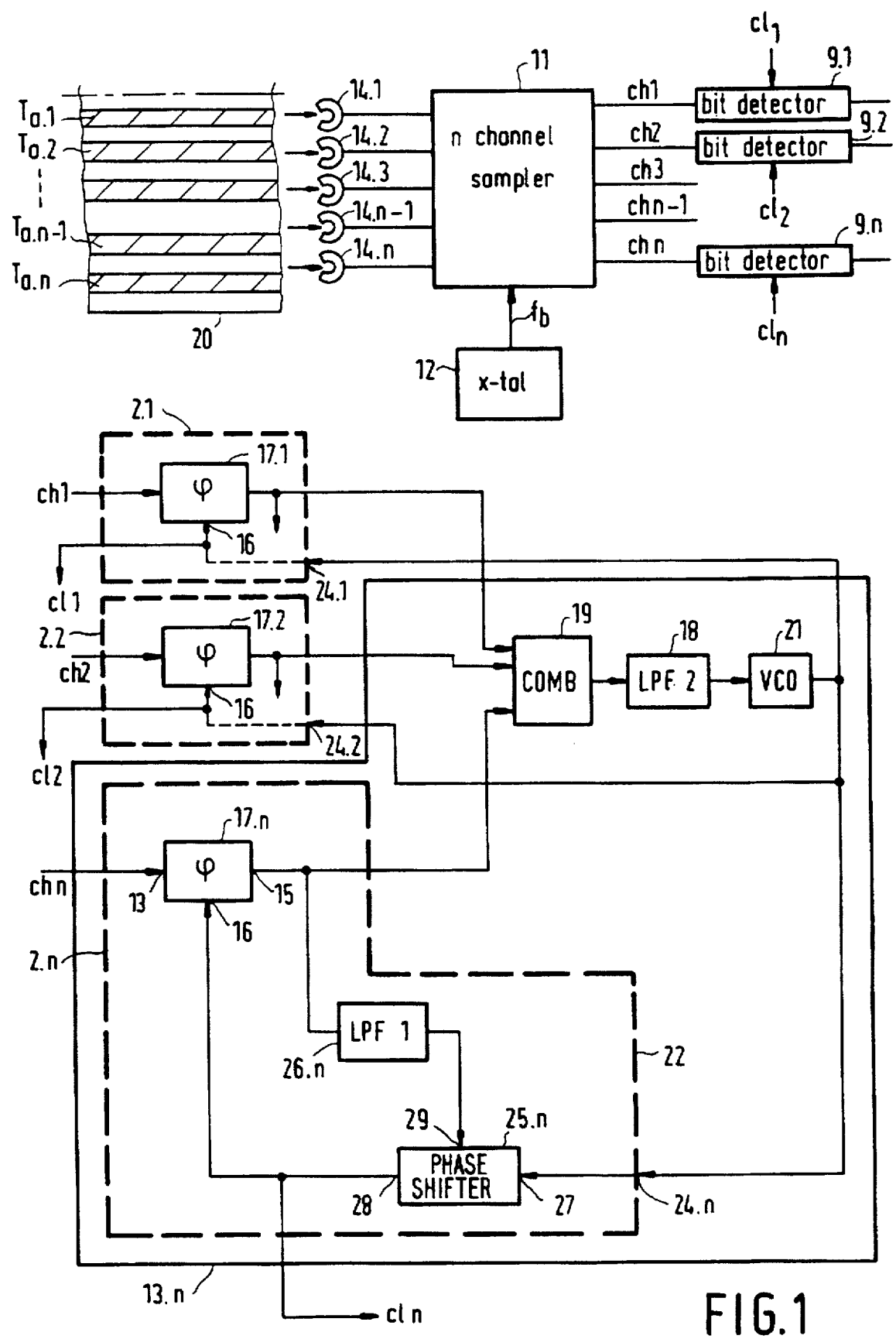
FIG. 1 shows the exemplary embodiment of the arrangement.

From each of the n binary signals $ch_i$ a clock signal $cl_i$ is derived, which is used for bit detection in bit detectors 9.1 to 9.n, whose inputs are coupled to outputs of the sampler 11, each bit detector 9.i having a clock-signal input for receiving the clock signal $cl_i$. For this purpose, the binary signals ch 1 to ch n are each applied to a respective one of the n phase-locked loops 13.1 to 13.n. Only the phase-locked loop 13.n is shown completely. The other phase-locked loops are similar. For each channel ch i of the channels ch 1 to ch n, i.e., also for the channel n, the corresponding binary signal is applied to a first input 13 of a phase comparator 17;n. The output of the phase comparator 17.n is coupled to the control-signal input of a voltage-controlled oscillator VCO 21 via a loop filter 18. The voltage controlled oscillator 21 can be a discrete-time oscillator. The loop filter 18 and the voltage-controlled oscillator 21 are common to all the n phase-locked loops 13.1 to 13.n.

However, the loop filter 18 may alternatively precede the signal combination unit 19 in the respective loops.

The output of the oscillator 21 is coupled to an input 27 of a phase shifter unit 25.n. The output 28 of the phase shifter unit 25.n is coupled to the second input 16 of the phase comparator 17.n. Each loop, as is shown for the loop 13.n, comprises a control signal generator unit 26.n in the form of an integrating element, such as, for example, a low-pass filter, whose input is coupled to the output of the phase comparator 17.n and whose output is coupled to a control-signal input 29 of the shifter unit 25.n.

The integrating element 26.n has a time constant which is comparatively large in comparison with the bit period $T_b$ in the digital signal. Preferably, the time constant is larger than 100 times the bit period, for example a few hundred times the bit period. The shifter unit 25.n produces a given delay of the signal applied to its input 27 under the influence of the control signal applied to the control-signal input 29.

Since the low-pass filter 18 and the voltage-controlled oscillator 21 are common to the loops 13.1 to 13.n, the outputs 15 of the phase comparators 17.1 to 17.n are all coupled to an input of a signal combination unit 19, for example, in the form of an adder, which has an output coupled to the loop filter 18.

Thus, each loop includes a block 2.n as indicated in broken lines. The output of the oscillator 21 is coupled to respective inputs 24.1 to 24.n of all the blocks 2.1 to 2.n. Furthermore, the signals applied to the second inputs 16 of the comparators 17.1 to 17.n in the blocks are supplied to the clock-signal inputs of the bit detectors 9.1 to 9.n as clock signals $cl_1$ to $cl_n$. Moreover, it is to be noted that the cut-off frequency of the low-pass filters 26.n will generally be the same and will be smaller than the cutoff frequency of the low-pass filter 18.

The arrangement operates as follows. The VCO 21 can be constructed as an accumulator. Such an accumulator each time adds with a given repetition rate a given constant Value cw to a value sw stored in the accumulator, which accumulated value acw is subsequently stored in the accumulator as the stored value. This means that the relation acw=cw+sw is valid each time. As a result, a sawtooth-shaped signal appears at the output of the VCO 21, which varies as a sawtooth with a given frequency between a positive and a negative threshold value +D and -D. If a control value rw is applied to the input of the VCO 21, the accumulator will perform the following accumulation: acw=(cw+rw)+sw. This results in a sawtooth-shaped signal of another sawtooth frequency appearing at the output of the VCO 21. The control loop controls the sawtooth frequency in such a manner that this frequency is substantially equal to the bit frequency in the signals being read, for example, the signal $ch_n$. The sawtooth-shaped signal is applied to the input 16 of the phase comparator 17.n after phase-shifting in the phase shifter 25.n. The operation of the phase comparator 17.n will be further explained by means of the signal waveforms shown in FIGS. 2a, 2b, 2c and 2d. FIG. 2a shows the sawtooth-shaped signal applied to the input 16 of the phase comparator 17.n, and FIG. 2b shows eye patterns in the signal applied to the input 13 of the phase comparator 17.n. FIG. 2d shows the actual signal applied to the input 13. The signal in FIG. 2a is also applied to the clock signal input of the bit detector 9.n. In the bit detector 9.n the falling edges in the signal of FIG. 2a produce clock pulses, shown in FIG. 2c, with which the signal $ch_n$ is sampled in the centres of the eye patterns, as shown in FIG. 2b, in order to obtain the digital signal. The clock frequency of the signal in FIG. 2c is $1/T_b$, which frequency corresponds to the bit frequency of the signal in FIGS. 2b and 2d. The value of the sawtooth-shaped signal in FIG. 2a is sampled under the influence of a rising or a falling edge in the signal shown in FIG. 2d. As is apparent from FIG. 2a, this yields sample values $b_1$ and $b_2$ which can serve as control values rw, as described hereinbefore.

The loop 13.n controls the oscillator 21 and hence the sawtooth frequency in such a manner that the samples at the instants $t_1$ and $t_2$, see FIG. 2d, yield sample values $b_1$ and $b_2$, respectively, which are substantially zero, so that the detection instants in the bit detector 9.n are timed correctly.

The signal combination unit 19 may take the form of an adder, after which the samples are averaged. It is also possible to construct the signal combination unit 19 as a multiplexer, the samples from the various loops being multiplexed with a multiplex frequency which should be at least n times the bit frequency. The control system thus effects averaging over the n channels, so that it does not produce an exactly correct value for any of the loops. Therefore, the phase shifter 25.n has been provided, which ensures that starting from the averaged control result such a phase shift or time shift is produced that the clock frequency $cl_n$ has exactly the correct sample phase. The phase shifter 25.n may take the form of a modulo-D counter. As a result, a phase shift is obtained which is proportional to the signal value applied to the control signal input 29 of the phase shifter 25.n.

It is to be noted that during locking-in, the bandwidth of the filter 26.n is extended in order to minimize the time required for locking-in. Moreover, it is to be noted that the circuit arrangement comprising the phase-locked loops for deriving the n clock signals from the signals $ch_1$ to $ch_n$ can be realized in integrated form or, if desired, in software form.

List of related documents
(1) U.S. patent application Ser. No. 08/184,624, filed on Jan. 19, 1994 (PHN 14.355)
(2) European patent application 93.201.327 corresponding to U.S. patent application Ser. No. 08/214,913, filed Mar. 17, 1994. (now U.S. Pat. No. 5,488,516. PHN 14.442)
(3) U.S. Pat. No. 4,470,082

I claim:

1. An arrangement for reproducing n digital signals from n adjacent tracks on a record carrier, n being an integer greater than 1, said arrangement comprising:

read means comprising n read heads, each having an output, for reading n information signals from the n adjacent tracks and applying said information signals to the outputs;

n detection means having inputs coupled to the outputs of the n read heads, for deriving the n digital signals from the n information signals read from the tracks and supplying said n digital signals to outputs, said n detection means having clock signal inputs for receiving a clock signal; and n phase-locked loops having respective inputs coupled to the n outputs of the n read heads, each phase-locked loop comprising a phase comparator having a first input coupled to the input of the phase-locked loop, a second input and an output; a phase-shifter unit having an input, an output coupled to the second input of the phase comparator and to an output of the phase-locked loop, and a control signal input; and a control signal generator unit having an input coupled to the output of the phase comparator and an output coupled to the control signal input of the phase-shifter unit; said n phase-locked loops further comprising, in common, a signal combination unit having an output and n inputs, each of the n inputs being coupled to the output of a respective one of the n phase comparators; and a voltage-controlled oscillator having an input coupled to the output of the signal combination unit, and an output for supplying a clock signal of a given frequency, the output of the voltage-controlled oscillator being coupled to the inputs of the n phase-shifter units, the outputs of said n phase-locked loops being coupled, respectively, to the clock signal inputs of said n detection means; characterized in that the control signal generator unit is an integrating element.

2. An arrangement as claimed in claim 1, characterized in that the integrating element has a time constant which is comparatively large relative to the bit period in the digital signal.

3. An arrangement as claimed in claim 2, characterized in that the time constant is larger than 100 times the bit period.

4. An arrangement as claimed in claim 1, characterized in that the voltage-controlled oscillator supplies an oscillator signal having a frequency substantially equal to the bit frequency in the digital signal.

5. An arrangement as claimed in claim 1, characterized in that the integrating element is a low-pass filter.

6. An arrangement as claimed in claim 5, characterized in that a second low-pass filter is coupled between the output of the signal combination unit and the input of the voltage-controlled oscillator, in that the cut-off frequency of the first-mentioned low-pass filter is lower than the cut-off frequency of the second low-pass filter.

7. An arrangement for deriving n clock signals from n information signals, comprising:

n inputs for receiving the n information signals;

n phase-locked loops having inputs coupled to the n inputs of the arrangement, each-phase-locked loop comprising a phase comparator having a first input, which is coupled to the input of the phase-locked loop, a second input and an outputs; a phase-shifter unit having an input, an output coupled to the second input of the phase comparator, and a control signal input; and a control signal generator unit having an input coupled to the output of the phase comparator and an output coupled to the control signal input of the phase-shifter unit; said n phase-locked loops further comprising, in common, a signal combination unit having an output and n inputs, each of the n inputs being coupled to the output of a respective one of the n phase comparators; and a voltage-controlled oscillator having an input coupled to the output of the signal combination unit, and an output for supplying a clock signal of a given frequency, the output of the voltage-controlled oscillator being coupled to the inputs of the n phase-shifter units; and n outputs for supplying the n clock signals, said n-outputs being coupled, respectively, to the outputs of the phase-shifter units in the n phase-locked loops to supply said n clock signals, characterized in that the control signal generator unit is an integrating element.

* * * * *